(12) United States Patent
Piwonka et al.

(10) Patent No.: US 11,762,575 B2
(45) Date of Patent: Sep. 19, 2023

(54) UPDATES TO FLASH MEMORY BASED ON DETERMINATIONS OF BITS TO ERASE

(71) Applicant: Hewlett-Packard Development Company, L.P., Spring, TX (US)

(72) Inventors: Mark A. Piwonka, Spring, TX (US); Stanley Hyojun Park, Spring, TX (US); Michael R. Durham, Spring, TX (US); Ted T. Nguy, Spring, TX (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 0 days.

(21) Appl. No.: 17/419,736

(22) PCT Filed: Jul. 31, 2019

(86) PCT No.: PCT/US2019/044371
§ 371 (c)(1),
(2) Date: Jun. 30, 2021

(87) PCT Pub. No.: WO2021/021161
PCT Pub. Date: Feb. 4, 2021

(65) Prior Publication Data
US 2022/0155990 A1 May 19, 2022

(51) Int. Cl.
*G06F 3/06* (2006.01)
*G06F 8/654* (2018.01)
*G06F 12/0891* (2016.01)

(52) U.S. Cl.
CPC .......... *G06F 3/0652* (2013.01); *G06F 3/0608* (2013.01); *G06F 3/0679* (2013.01);
(Continued)

(58) Field of Classification Search
None
See application file for complete search history.

(56) References Cited

U.S. PATENT DOCUMENTS 5,574,684 A * 11/1996 Tomoeda ........... G11C 16/3445
365/185.11
7,017,004 B1 3/2006 Calligaro et al.
(Continued)

FOREIGN PATENT DOCUMENTS

CN 108089872 A 5/2018
WO WO-2016047312 A1 * 3/2016 ......... B60R 16/0231

OTHER PUBLICATIONS

Anonymous, "Understanding Flash: Blocks, Pages and Program/Erases", Jun. 20, 2014, pp. 1-5, https://flashdba.com/2014/06/20/understanding-flash-blocks-pages-and-program-erases/ (Year: 2014).*
(Continued)

*Primary Examiner* — Christopher D Birkhimer
(74) *Attorney, Agent, or Firm* — Quarles & Brady LLP

(57) ABSTRACT

An example non-transitory machine-readable storage medium storing machine-readable instructions which when executed cause a processor to obtain stored bits stored on a flash memory, each of the stored bits in a set state or an unset state. The processor further obtains target bits, each of the target bits in the set state or the unset state, wherein each target bit corresponds to a stored bit to update the stored bit. The processor further determines whether, for one stored bit in the set state, the corresponding target bit is in the unset state. When the determination is positive, the processor sets the stored bits to the unset state and, after setting the stored bits to the unset state, updates the stored bits to match the corresponding target bits. When the determination is negative, the processor updates the stored bits to match the corresponding target bits.

15 Claims, 6 Drawing Sheets

(52) U.S. Cl.
CPC .......... *G06F 8/654* (2018.02); *G06F 12/0891* (2013.01); *G06F 2212/1041* (2013.01); *G06F 2212/222* (2013.01)

(56) References Cited

U.S. PATENT DOCUMENTS

| | | | |
|---|---|---|---|
| 7,756,833 | B2 | 7/2010 | Van Ingen et al. |
| 7,831,789 | B1 | 11/2010 | Per et al. |
| 9,372,755 | B1* | 6/2016 | Bruce ................... G06F 3/0653 |
| 2006/0155922 | A1 | 7/2006 | Gorobets et al. |
| 2007/0027937 | A1 | 2/2007 | McGrattan et al. |
| 2010/0293141 | A1 | 11/2010 | Anand et al. |
| 2011/0202735 | A1 | 8/2011 | Kono et al. |
| 2012/0151180 | A1* | 6/2012 | Yeh ..................... G06F 12/0246 711/E12.078 |
| 2012/0254549 | A1* | 10/2012 | Hutchison ........... G06F 12/0246 711/E12.04 |
| 2012/0311237 | A1* | 12/2012 | Park .................... G06F 12/0246 711/E12.008 |
| 2013/0024641 | A1* | 1/2013 | Talagala .............. G06F 11/3442 711/170 |
| 2013/0282958 | A1* | 10/2013 | Shepard ............... G11C 16/349 711/E12.016 |
| 2014/0321210 | A1 | 10/2014 | Xiang |
| 2015/0149694 | A1* | 5/2015 | Tuers ................... G06F 3/0659 711/103 |
| 2015/0262714 | A1* | 9/2015 | Tuers ................. G11C 16/3422 714/721 |
| 2015/0301933 | A1* | 10/2015 | Tuers .................. G06F 12/0246 714/773 |
| 2018/0329770 | A1* | 11/2018 | Saito .................. G11C 16/3431 |
| 2019/0034100 | A1 | 1/2019 | Wallace et al. |
| 2019/0212999 | A1 | 7/2019 | Chen |

OTHER PUBLICATIONS

Anonymous, "Flash Write: Realy need to erase before?", Mar. 12, 2010, pp. 1-3, https://www.microchip.com/forums/m485168.aspx (Year: 2010).*

Anonymous, "Do you know what it is Flash Memory", Aug. 11, 2016, pp. 1-3, https://web.archive.org/web/20160811110733/https://www.minitool.com/lib/flash-memory.html (Year: 2016).*

Anonymous, "How Flash Memory Works—Advantages & Disadvantages", Oct. 9, 2018, pp. 1-4, https://www.arrow.com/en/research-and-events/articles/how-flash-memory-works-advantages-and-disadvantages (Year: 2018).*

Texas Instruments, "MSP430 Flash Memory Characteristics", Aug. 2018, pp. 1-10, https://www.ti.com/lit/an/slaa334b/slaa334b.pdf?ts=1671176812297&ref_url=https%253A%252F%252Fwww.google.com%252F (Year: 2018).*

Kevin M. Lynch et al., "Flash Memory", 2016, pp. 1-6, https://www.sciencedirect.com/topics/engineering/flash-memory#:~:text=Flash%20memory%20is%20a%20long,programmable%20read%2Donly%20memory). (Year: 2016).*

Meena et al., "Overview of emerging nonvolatile memory technologies", Nanoscale Research Letters, 2014, pp. 1-33, https://doi.org/10.1186/1556-276X-9-526 (Year: 2014).*

* cited by examiner

UPDATES TO FLASH MEMORY BASED ON DETERMINATIONS OF BITS TO ERASE

BACKGROUND

Flash memory may be updated by a flashing process, in which the flash memory is erased, and the update is written to the blank memory. Erasing flash memory may be time-consuming, resulting in a time-consuming flashing process.

DETAILED DESCRIPTION

Computing devices, such as personal computers, laptops, desktops, or other types of computing devices, may have programs, such as a basic input/output system (BIOS) stored on memory, such as flash memory. Flash memory may be updated by a flash operation, in which the flash memory is erased and then an update is written to the blank or erased memory. Erase operations are lengthy and time-consuming, leading to lengthy and time-consuming flash operations. Further, erase operations may not be performed on a bit-by-bit basis and are performed on sectors having a minimum size (e.g., a minimum number of bits).

In an example flash operation, a processor obtains bits stored on a flash memory. Each of the stored bits is in a set state or an unset state. For example, bits having a value of "1" may be defined as being in the unset state, while bits having a value of "0" may be defined as being in the set state. The processor further obtains target bits. Each of the target bits is in the set state or the unset state. Additionally, each target bit corresponds to a stored bit and represents a value to which the stored bit is to be updated. The processor determines whether, for one stored bit in the set state, the corresponding target bit is in the unset state. When the determination is positive, the processor sets the stored bits to the unset state and, after setting the stored bits to the unset state, updates the stored bits to match the corresponding target bits. When the determination is negative, the processor updates the stored bits to match the corresponding target bits. The processor thus determines the type of updates (e.g., an erase operation from the set state to the unset state, or a write operation from the unset state to the set state) and selects the appropriate update process. If any of the stored bits are to be erased, the processor performs a flash operation (i.e., an erase operation followed by a write operation) on all the stored bits. If the only updates are write operations, the processor performs bit-wise write operations. Thus, unnecessary erase operations, which are lengthy and time-consuming, may be reduced. The flash operation may be performed during manufacture, during an update to the flash memory (e.g., an update to the BIOS), or during a recovery process.

Figure 1:
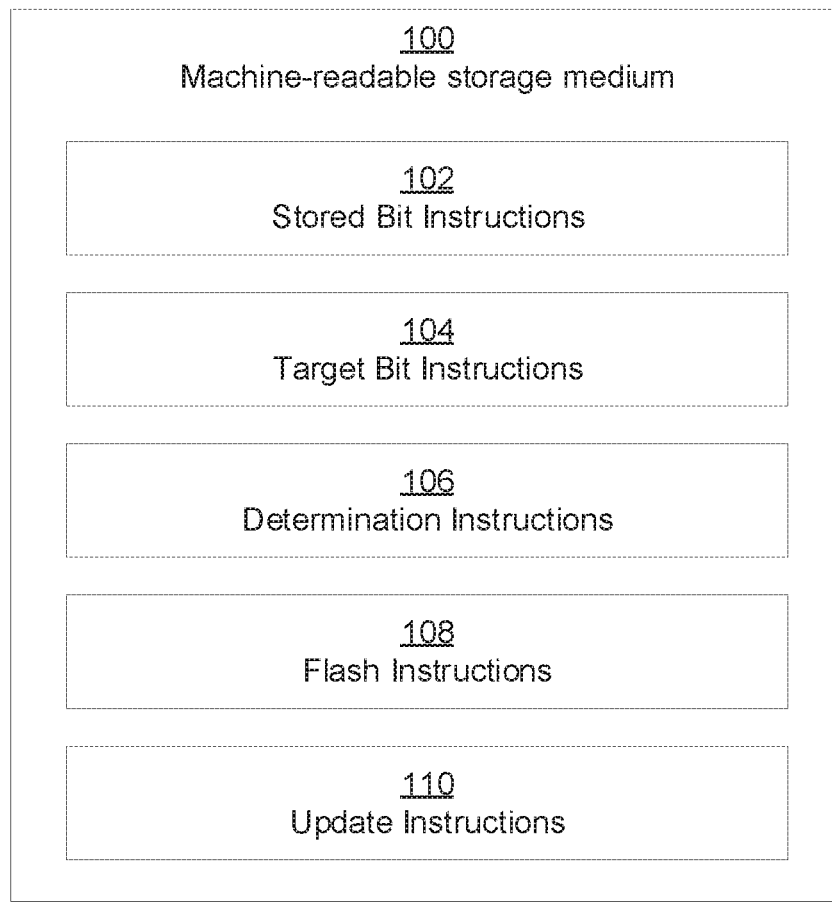
FIG. 1 is a block diagram of an example machine-readable storage medium with instructions for updates to flash memory based on determinations of bits to erase.

FIG. 1 shows a block diagram of a non-transitory machine-readable storage medium 100 storing machine-readable instructions. The storage medium 100 includes stored bit instructions 102, target bits instructions 104, determination instructions 106, flash instructions 108, and update instructions 110.

The stored bit instructions 102, when executed, cause a processor to obtain stored bits stored on a flash memory. Each of the stored bits may be in a set state or an unset state.

The target bit instructions 104, when executed, cause the processor to obtain target bits, Each of the target bits may also be in the set state or the unset state. In particular, each target bit corresponds to one of the stored bits and represents the state (i.e., set or unset) to which the stored bit is to be updated.

The determination instructions 106, when executed, cause the processor to determine whether, for one stored bit in the set state, the corresponding target bit is in the unset state. In particular, erase operations (setting bits from the set state to the unset state) have a minimum sector size. That is, erase operations may not be performed on a bit-by-bit basis and are performed on a sector having a minimum number of bits. Thus, the determination instructions 106 are to determine if any stored bits in the set state are to be updated to the unset state, the sector is erased (i.e., set to the unset state).

The flash instructions 108, when executed, cause the processor to perform a flash operation. In particular, the processor performs the flash operation on the flash memory when the determination is positive. The processor sets the stored bits to the unset state (i.e., performs an erase operation on at least the minimum sector). After setting the stored bits to the unset state, the processor updates the stored bits to match the corresponding target bits (i.e., performs an update operation on the stored bits).

The update instructions 110, when executed, cause the processor to perform an update operation. In particular, the processor performs the update operation on the flash memory when the determination is negative. The processor updates the stored bits to match the corresponding target bits. In particular, since no stored bits are to be set from the set state to the unset state, the processor either updates the stored bits from the unset state to the set state or leaves the stored bits in their current state.

Figure 2:
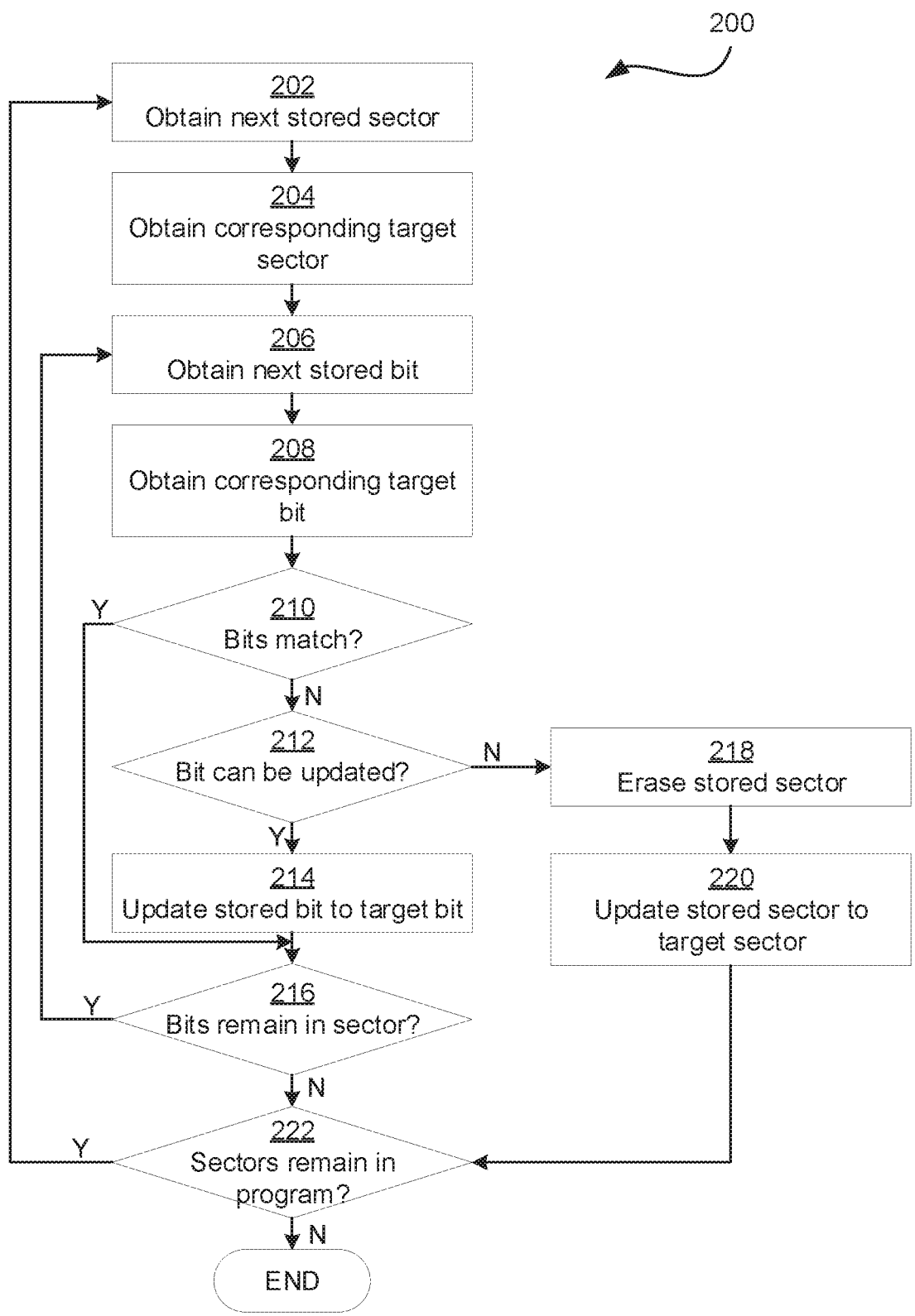
FIG. 2 is a flowchart of an example method for updates to flash memory based on determinations of bits to erase.

FIG. 2 shows a flowchart of an example method 200 of updating a flash memory. In particular, the flash memory may store a program, such as a basic input/output system (BIOS), to be updated. The program may be stored in the flash memory as stored bits. Each of the bits may be in a set state or an unset state. A write or update operation may be performed on a bit in the unset state by updating the bit to the set state. An erase operation may be performed by setting bits to the unset state. In particular, erase operations are not performed bit-wise and are performed on a minimum number of bits. The method 200 may be performed by a processor capable of executing instructions, such as the instructions stored in the machine-readable storage medium 100.

In some examples, the method 200 may be performed during a manufacturing process. For example, the processor may be a manufacturing processor. In particular, the manufacturing processor may perform the method 200 to update a flash memory with a BIOS prior to securing the flash memory to a motherboard. In other examples, the processor may perform the method 200 after the flash memory is secured to the motherboard during an in-circuit test. For example, the processor may be integrated with a bed-of-nails fixture to update the flash memory with the BIOS during the in-circuit testing. In further examples, the method 200 may be performed in a computing device to update or restore the BIOS. For example, the processor may be a security controller of the computing device, and may update a protected copy of the BIOS at the first instance of receiving power. In other examples, other suitable processors or systems may perform the method 200.

Figure 3A:
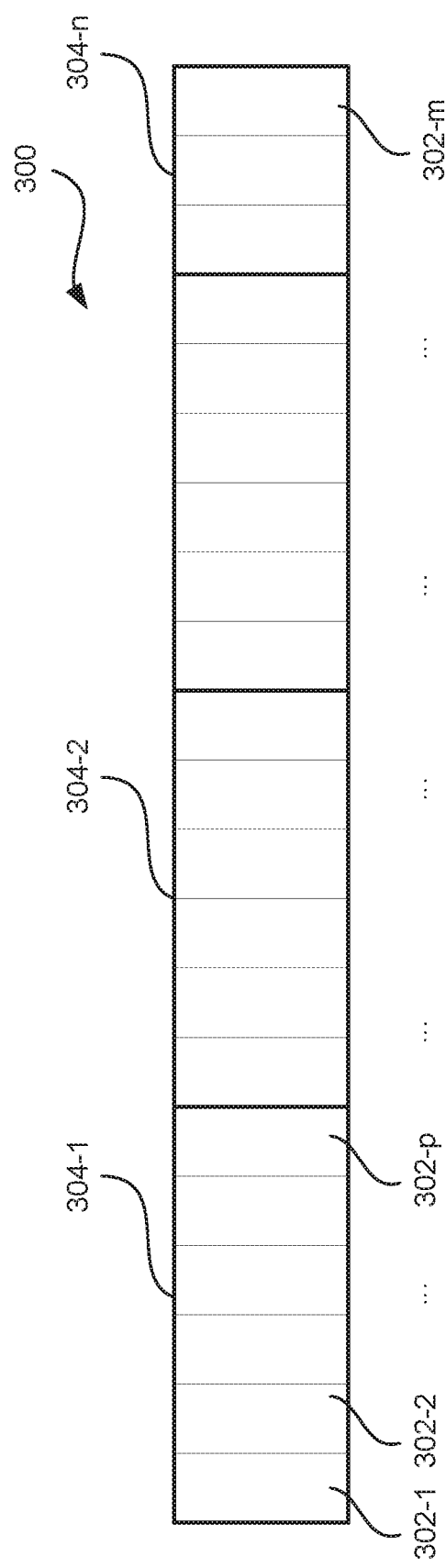
FIG. 3A is a schematic diagram of an example stored program to be updated based on determinations of bits to erase.

At block 202, the processor obtains a stored sector of the program to be updated. In particular, the processor is to update the program in smaller portions represented by the stored sectors. The stored sector therefore includes a subset of the stored bits which form the program. For example, the stored sectors may be selected based on the minimum number of bits for an erase operation. For example, referring to FIG. 3A, a stored program 300 is depicted. The stored program includes stored bits 302-1, 302-2 to 302-*m*. The stored bits may be grouped into stored sectors 304-1, 304-2 to 304-*n*. For example, the stored sector 304-1 may include the stored bits 302-1, 302-2 through to 302-*p*, where p is the minimum number of bits for an erase operation. Accordingly, at block 202 of FIG. 2, the processor may obtain, for example, the stored sector 304-1 for processing.

In some examples, the processor may also perform pre-processing operations on the stored sector. For example, the stored sector 304-*n* may not include p bits based on the size of the stored program 300. Accordingly, the processor may expand the stored sector 304-*n* to include p bits by adding a sufficient number of bits in the unset state after the stored bit 302-*m*. In particular, the stored sector 304-*n* may be expanded to allow for erase operations to be performed.

In some examples, the program to be updated may be pre-populated with a subset of the target bits from the target program. For example, during a manufacturing process, the flash memory may be pre-populated with portions of the BIOS.

Figure 3B:
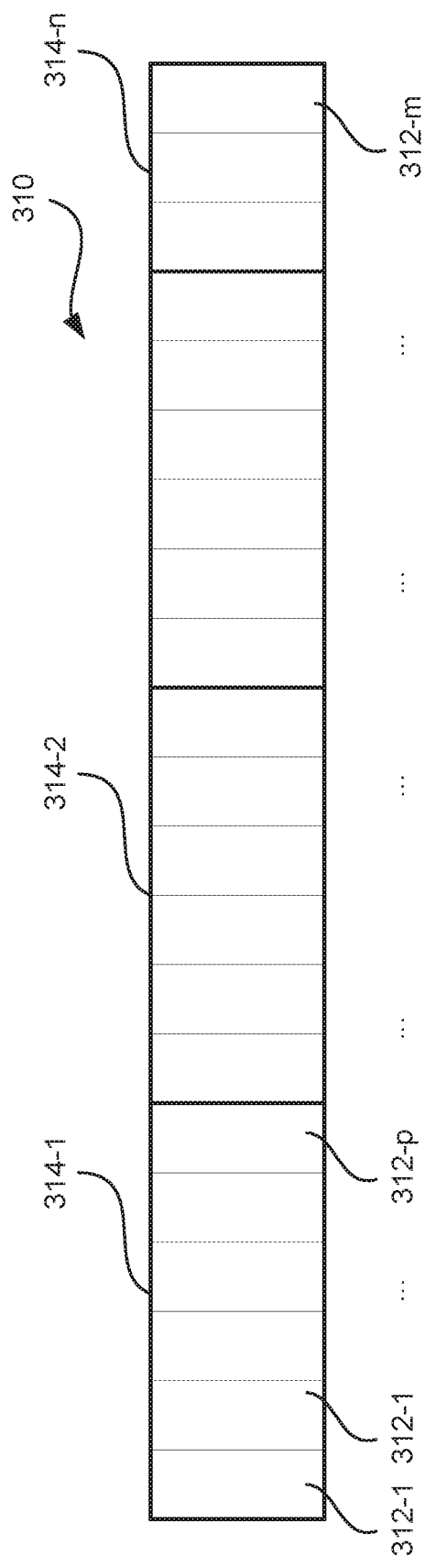
FIG. 3B is a schematic diagram of an example target program to update the stored program of FIG. 3A.

At block 204, the processor obtains the target sector corresponding to the stored sector obtained at block 202. In particular, the target program includes target bits, each of which correspond to a stored bit. Accordingly, each stored sector may define a corresponding target sector based on the target bits which correspond to the stored bits in the stored sector. For example, referring to FIG. 3B, a target program 310 is depicted. The target program 310 includes target bits 312-1, 312-2 to 312-*m* which correspond, respectively, to the stored bits 302-1, 302-2 to 302-*m*. The target bits may also be grouped into target sectors 314-1, 314-2 to 314-*n*. Similarly, the target sectors correspond, respectively, to the stored sectors 304-1, 304-2, to 304-*n*. For example, the target sector 314-1 includes the target bits 312-1, 312-2, through to 312-*p*. Accordingly, at block 204 of FIG. 2, the processor may obtain, for example, the target sector 314-1 corresponding to the stored sector 304-1 obtained at block 202.

In some examples, the processor may also perform pre-processing operations on the target sector. For example, the target sector 314-*n* may be the same size as the stored sector 304-*n* and hence may not include p bits. Accordingly, the processor may expand the target sector 314-*n* to include p bits by adding a sufficient number of bits in the unset state after the target bit 312-*m*. In particular, the target sector 314-*n* may be expanded to allow for a bit-by-bit comparison with the stored sector 304-*n*.

In some examples, at block 204, the processor may additionally obtain a buffer sector. The buffer sector is a pre-defined sector having the minimum number of bits to perform an erase operation (i.e., p bits). In particular, the buffer sector includes buffer bits which are in the unset state. In particular, the buffer sector may be utilized if it is determined that the processor is to perform an erase operation.

At block 206, the processor begins processing the sector using a bit-by-bit process. In particular, the processor obtains a stored bit from the stored sector obtained at block 202. For example, the processor may obtain the stored bit 302-1.

At block 208, the processor obtains the target bit corresponding to the stored bit obtained at block 206. For example, the processor may obtain the target bit 312-1.

At block 210, the processor determines whether the bits obtained at blocks 206 and 208 match. If they match, the method 200 proceeds directly to block 216. If the bits do not match, the method 200 proceeds to block 212.

At block 212, the processor determines whether the stored bit obtained at block 206 can be updated to the target bit obtained at block 208. In particular, if the stored bit is in the unset state, and the target bit is in the set state, then the processor determines that the stored bit may be updated, and the method 200 proceeds to block 214.

At block 214, the processor updates the stored bit to match the corresponding target bit. The method 200 then proceeds to block 216.

At block 216, the processor determines whether there are any stored bits left to process in the sector. If there are, the method 200 returns to block 206, where the processor obtains the next stored bit for processing. If there are no stored bits in the sector which are in the set state, and whose corresponding target bit is in the unset state, the method 200 proceeds in this manner until all the stored bits in the stored sector have been updated to match the corresponding target bits.

Figure 4A:
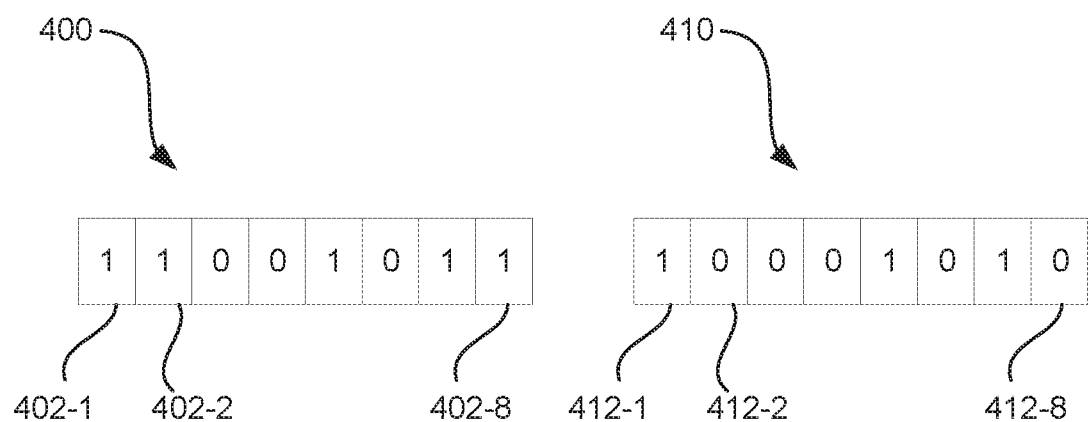
FIG. 4A is a schematic diagram of an example stored sector and target sector.
Figure 4B:
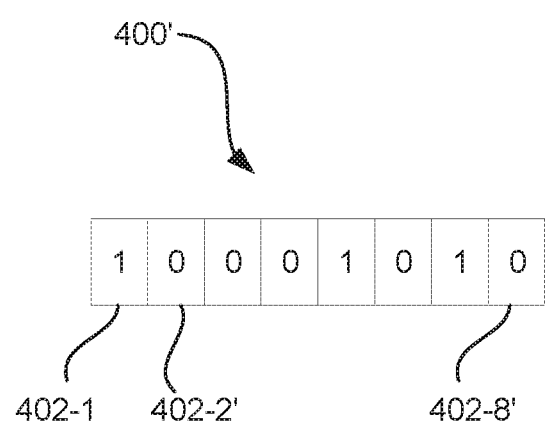
FIG. 4B is a schematic diagram of an example updated stored sector.

For example, referring to FIGS. 4A and 4B, an example stored sector 400 and its corresponding target sector 410 are depicted. In the present example, bits having a value of "1" are in the unset state, while bits having a value of "0" are in the set state. In particular, the processor may update the stored sector 400 according to iterations through blocks 206, 208, 210, 212, 214, and 216 of the method 200 described above, in which all the stored bits are either matching, or are updated from the unset state to the set state to match the corresponding target bits.

For example, the stored bit 402-1 is in the unset state and matches the corresponding target bit 412-1 in the unset state. Accordingly, at block 210, the method 200 proceeds to block 216 and returns to block 206, where the processor selects the next stored bit 402-2. The stored bit 402-2 is in the unset state, and its corresponding target bit 412-2 is in the set state. Accordingly, at block 212, the method proceeds to block 214, where the processor updates the stored bit 402-2 to match the target bit 412-2. In particular, the stored bit 402-2 is updated to an updated bit 402-2' depicted in FIG. 4B, which is in the set state. The processor iterates through the stored bits in the sector 400 until the stored bit 402-8 is updated to updated bit 402-8'. Accordingly, at block 216, no stored bits remain in the stored sector 400 and the updated sector 400' has been updated to match the corresponding target sector 410.

Returning to FIG. 2, if, at block 212, the stored bit is in the set state and the target bit is in the unset state, then the processor determines that the stored bit may not be updated, and the method proceeds to block 218.

At block 218, the processor erases the stored sector by setting all the stored bits in the stored sector to the unset state. For example, the processor may utilize the buffer sector obtained at block 204 and replace the stored sector with the buffer sector.

At block 220, the processor updates the stored sector to match the corresponding target sector. In particular, the stored sector contains only stored bits in the unset state, and can be updated bit-wise to match the corresponding target bits in the target sector.

Figure 5A:
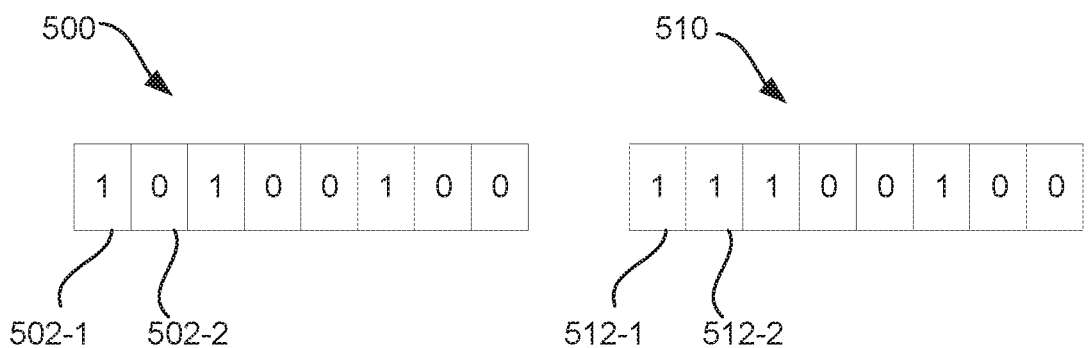
FIG. 5A is a schematic diagram of an example stored sector and target sector.
Figure 5B:
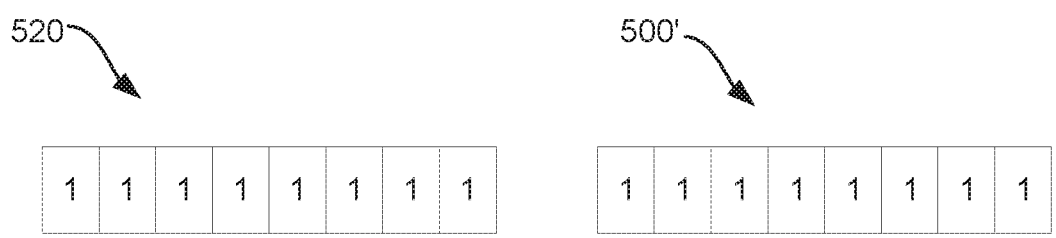
FIG. 5B is a schematic diagram of an example buffer sector and erased stored sector.
Figure 5C:
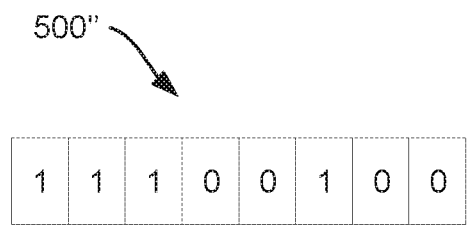
FIG. 5C is a schematic diagram of an example updated stored sector.

For example, referring to FIGS. 5A, 5B, and 5C, an example stored sector 500 and its corresponding target sector 510 are depicted. In the present example, bits having a value of "1" are in the unset state, while bits having a value of "0" are in the set state. In particular, the processor may update the stored sector 500 according to blocks 218 and 220.

First, the processor may iterate through iterations of blocks 206 through 216, as appropriate. For example, the stored bit 502-1 is in the unset state and matches the corresponding target bit 512-1 in the unset state. Accordingly, at block 210, the method 200 proceeds to block 216 and returns to block 206, where the processor selects the next stored bit 502-2. The stored bit 502-2 is in the set state, and its corresponding target bit 512-2 is in the unset state. Accordingly, at block 212, the method proceeds to block 218.

At block 218, the processor may set the stored bits in the stored sector 500 to the unset state, for example, by obtaining a buffer sector 520 having all bits in the unset state and replacing the stored sector 500 with the buffer sector 520 to obtain an erased stored sector 500', as depicted in FIG. 5B.

At block 220, the processor updates the erased stored bits in the erased stored sector 500' to match the corresponding target sector 510 to obtain updated stored sector 500", as depicted in FIG. 5C.

Returning to FIG. 2, at block 222, having updated the stored sector to match the corresponding target sector by either direct update operations (blocks 210 through 216) or by a flash operation (blocks 218 and 220), the processor determines whether any sectors remain in the program to process to update the program.

Figure 6:
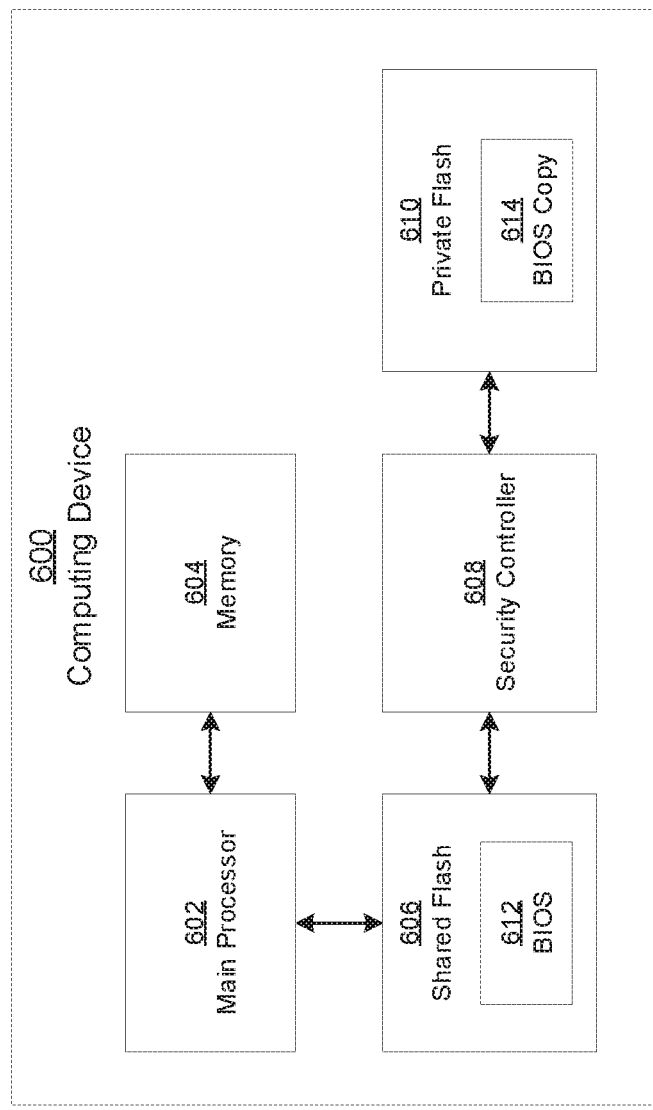
FIG. 6 is an example computing device for updating flash memory based on determinations of bits to erase.

FIG. 6 shows a block diagram of an example computing device 600. The computing device 600 includes a main processor 602, a memory 604, a shared flash memory 606, a security controller 608 and a private flash memory 610.

The main processor 602 is interconnected with the memory 604 and the shared flash memory 606. The main processor 602 may include a central processing unit (CPU), a microcontroller, a microprocessor, a processing core, a field-programmable gate array (FPGA), or similar device capable of executing instructions. The main processor 602 may cooperate with the memory 604 to execute instructions. The memory 604 may include a non-transitory machine-readable storage medium that may be may electronic, magnetic, optical, or other physical storage device that stores executable instructions. The machine-readable storage medium may include, for example, random access memory (RAM), read-only memory (ROM), electrically-erasable programmable read-only memory (EEPROM), flash memory, a storage drive, an optical disc, and the like. The machine-readable storage medium may be encoded with executable instructions. For example, the memory 604 may include instructions to update a basic input/output system (BIOS) 612 stored on the shared flash memory 606.

The shared flash memory 606 is a flash memory storing the BIOS 612. The private flash memory 610 is a flash memory storing a protected copy 614 of the BIOS 612. In particular, the private flash memory 610 is accessible by the security controller 608. The BIOS 612 may be represented in the shared flash 606 as stored bits, each stored bit in a set state or an unset state. Similarly, the protected BIOS copy 614 may be represented in the private flash memory 610 as stored bits, each stored bit in a set state or an unset state.

The security controller 608 is interconnected with the shared flash memory 606 and the private flash memory 610. The security controller 608 may also include a central processing unit (CPU), a microcontroller, a microprocessor, a processing core, a field-programmable gate array (FPGA), or similar device capable of executing instructions. In particular, the security controller 608 is to perform updates between the shared flash memory 606 and the private flash memory 610.

For example, the BIOS 612 may be updated, such as during a system upgrade or the like. In particular, the BIOS 612 may be updated via execution of instructions by the main processor 602. The security controller 608 may detect the update to the BIOS 612 and update the protected BIOS copy 614. In some examples, the security controller 608 may further verify the updated BIOS 612 prior to updating the protected BIOS copy 614 stored in the private flash memory 610. The security controller 608 may thus detect tampering with the BIOS 612 and may reject the update to the protected BIOS copy 614 if the verification fails.

Upon verifying the update to the BIOS 612, the security controller 608 may update the protected BIOS copy 614. In particular, the security controller 608 may designate the protected BIOS copy 614 as the stored program, and the BIOS 612 as the target program in the method 200.

Accordingly, the security controller 608 obtains a stored sector of the protected BIOS copy 614 and a corresponding target sector of the updated BIOS 612. The security controller 608 determines whether, for one stored bit of the stored sector of the protected BIOS copy 614 in the set state, the corresponding target bit of the updated BIOS 612 is in the unset state. When the determination is positive, the security controller 608 sets the stored bits of the stored sector of the protected BIOS copy 614 to the unset state. After setting the stored bits to the unset state, the security controller 608 updates the stored bits to match the corresponding target bits of the updated BIOS 612. If the determination is negative, the security controller 608 updates the stored bits to match the corresponding target bits of the updated BIOS 612. The security controller 608 may thus proceed through sectors of the protected BIOS copy 614 to update the protected BIOS copy 614 to match the updated BIOS 612.

In another example, during a verification of the BIOS 612, the security controller 608 may determine that the BIOS 612 is invalid, corrupted, or otherwise not viable for execution, for example during a boot of the computing device 600. Accordingly, the security controller 608 may execute a recovery operation to restore the BIOS 612 to the protected BIOS copy 614. In particular, the security controller 608 may designate the BIOS 612 as the stored program and the protected BIOS copy 614 as the target program in the method 200.

Accordingly, the security controller 608 obtains a stored sector of the BIOS 612 and a corresponding target sector of the protected BIOS copy 614. The security controller 608 determines whether, for one stored bit of the stored sector of the BIOS 612 in the set state, the corresponding target bit of the protected BIOS copy 614 is in the unset state. When the determination is positive, the security controller 608 sets the stored bits of the stored sector of the BIOS 612 to the unset state. After setting the stored bits to the unset state, the security controller 608 updates the stored bits to match the corresponding target bits of the protected BIOS copy 614. If the determination is negative, the security controller 608 updates the stored bits to match the corresponding target bits of the protected BIOS copy 614. The security controller 608 may thus proceed through sectors of the BIOS 612 to restore the BIOS 612 to match the protected BIOS copy 614.

As described above, a processor may perform updates to flash memory based on determinations of bits to erase. The processor obtains stored bits and target bits, each of the bits in the set state or the unset state. The processor determines whether, for one stored bit in the set state, the corresponding target bit is in the unset state. That is, the processor determines whether there are stored bits to erase (i.e., set from the set state to the unset state). When the determination is positive, the processor sets the stored bits to the unset state and, after setting the stored bits to the unset state, updates the stored bits to match the corresponding target bits. In particular, the processor may set the stored bits to the unset state according to the minimum number of bits for an erase operation. When the determination is negative, the processor updates the stored bits to match the corresponding target bits.

Thus, based on the determination of bits to erase, the processor selects an appropriate update operation. If any of the stored bits are to be erased, the processor performs a flash operation (i.e., an erase operation followed by a write operation) on all the stored bits. If the only updates are write operations, the processor performs bit-wise write operations. Thus, unnecessary erase operations, which are lengthy and time-consuming, may be reduced. The flash operation may be performed during manufacture, during an update to the flash memory (e.g., an update to the BIOS), or during a recovery process.

The scope of the claims should not be limited by the above examples, but should be given the broadest interpretation consistent with the description as a whole.

The invention claimed is:

1. A non-transitory machine-readable storage medium storing machine-readable instructions which, when executed, cause a processor to:
    obtain stored bits stored on a flash memory, each of the stored bits in a set state or an unset state;
    obtain target bits, each of the target bits in the set state or the unset state, wherein each target bit corresponds to a stored bit to update the stored bit;
    determine whether, for one stored bit in the set state, the corresponding target bit is in the unset state; and
    when the determination is positive:
        set the stored bits to the unset state; and
        after setting the stored bits to the unset state, update the stored bits to match the corresponding target bits; and
    when the determination is negative:
        update the stored bits to match the corresponding target bits.

2. The non-transitory machine-readable storage medium of claim 1, wherein the stored bits form a stored sector of a stored program to be updated to a target program; and wherein the target bits form a target sector of the target program.

3. The non-transitory machine-readable storage medium of claim 2, wherein the stored sector comprises a minimum number of bits to set the stored bits of the stored sector to the unset state.

4. The non-transitory machine-readable storage medium of claim 3, wherein the instructions cause the processor to set the stored bits to the unset state by:
    obtaining a buffer sector comprising buffer bits in the unset state, wherein the buffer sector comprises the minimum number of bits to set the stored bits of the stored sector to the unset state; and
    replacing the stored sector with the buffer sector.

5. A computing device comprising:
    a first flash memory storing stored bits, each of the stored bits in a set state or an unset state;
    a second flash memory storing target bits, each of the target bits in the set state or the unset state, wherein each target bit corresponds to a stored bit to update the stored bit;
    a security controller interconnected with the first flash memory and the second flash memory, the security controller to:
        determine whether, for one stored bit in the set state, the corresponding target bit is in the unset state; and
        when the determination is positive:
            set the stored bits to the unset state; and
            after setting the stored bits to the unset state, update the stored bits to match the corresponding target bits; and
        when the determination is negative:
            update the stored bits to match the corresponding target bits.

6. The computing device of claim 5, wherein the stored bits define a basic input/output system stored in the first flash memory; and
    wherein the target bits define a protected basic input/output system copy stored in the second flash memory to restore the basic input/output system.

7. The computing device of claim 5, wherein the stored bits define a protected basic input/output system copy in the first flash memory; and
    wherein the target bits define an updated basic input/output system stored in the second flash memory to update the protected basic input/output system copy.

8. The computing device of claim 5, wherein the stored bits form a stored sector of a stored program to be updated to a target program; and wherein the target bits form a target sector of the target program.

9. The computing device of claim 8, wherein the stored sector comprises a minimum number of bits to set the stored bits of the stored sector to the unset state.

10. The computing device of claim 9 wherein the security controller is to set the stored bits to the unset state by:
    obtaining a buffer sector comprising buffer bits in the unset state, wherein the buffer sector comprises the minimum number of bits to set the stored bits of the stored sector to the unset state; and
    replacing the stored sector with the buffer sector.

11. A method comprising:
    obtaining stored bits stored on a flash memory, each of the stored bits in a set state or an unset state;
    obtaining target bits, each of the target bits in the set state or the unset state, wherein each target bit corresponds to a stored bit to update the stored bit;

determining whether, for one stored bit in the set state, the corresponding target bit is in the unset state; and when the determination is positive:
  setting the stored bits to the unset state; and
  after setting the stored bits to the unset state, updating the stored bits to match the corresponding target bits; and when the determination is negative:
  updating the stored bits to match the corresponding target bits.

12. The method of claim 11, further comprising pre-populating the flash memory with a subset of the target bits.

13. The method of claim 11, wherein the stored bits form a stored sector of a stored program to be updated to a target program; and wherein the target bits form a target sector of the target program.

14. The method of claim 13, wherein the stored sector comprises a minimum number of bits for setting the stored bits to the unset state.

15. The method of claim 14, wherein setting the stored bits to the unset state comprises:
  obtaining a buffer comprising buffer bits in the unset state, wherein the buffer comprises the minimum number of bits to set the stored bits of the stored sector to the unset state; and
  replacing the stored sector with the buffer.

* * * * *